United States Patent [19]

Peterson

[11] 4,132,168

[45] Jan. 2, 1979

[54] PRESENSITIZED PRINTING PLATE WITH IN-SITU, LASER IMAGEABLE MASK

[75] Inventor: John O. H. Peterson, Cape Elizabeth, Me.

[73] Assignee: Scott Paper Company, Philadelphia, Pa.

[21] Appl. No.: 818,644

[22] Filed: Jul. 25, 1977

Related U.S. Application Data

[63] Continuation of Ser. No. 434,255, Jan. 17, 1974, abandoned.

[51] Int. Cl.$^2$ ............................ B41C 1/10; G03F 7/08
[52] U.S. Cl. .................................. 101/471; 101/401.1; 346/76 L; 96/33
[58] Field of Search ..................... 101/167, 471, 401.1; 346/76 L

[56] References Cited

U.S. PATENT DOCUMENTS

| | | | |
|---|---|---|---|
| 3,207,621 | 9/1965 | Newman | 117/36.1 |
| 3,373,021 | 3/1968 | Adams | 101/467 |
| 3,392,501 | 7/1968 | Gilchrest | 101/426 |
| 3,493,371 | 2/1970 | Poot | 96/36.3 |
| 3,574,657 | 4/1971 | Burnett | 96/36.3 |
| 3,619,157 | 11/1971 | Brinckman | 101/463 |
| 3,650,796 | 3/1972 | Jackson | 427/53 |
| 3,660,088 | 5/1972 | Lundsager | 96/36 |
| 3,689,768 | 9/1972 | Sato | 346/135 |
| 3,707,372 | 12/1972 | Hallman | 96/35 |
| 3,773,514 | 11/1973 | Fromson | 96/36 |
| 3,832,948 | 9/1974 | Barker | 101/401.1 |
| 3,934,503 | 1/1976 | Kinney | 96/36.4 |

Primary Examiner—Clyde I. Coughenour
Attorney, Agent, or Firm—R. Duke Vickrey; John W. Kane, Jr.

[57] ABSTRACT

A presensitized planographic printing plate which is imaged by exposure to conventional ultraviolet light sources through a mask which is formed on the surface of the plate by means of a laser beam.

1 Claim, No Drawings

PRESENSITIZED PRINTING PLATE WITH IN-SITU, LASER IMAGABLE MASK

This is a continuation, of application Ser. No. 434,255 filed Jan. 17, 1974, now abandoned.

BACKGROUND OF THE INVENTION

1. Field of the Invention

This invention relates to planographic printing plates and, more particularly, to plates having a mask layer capable of being selectively removed by a laser beam to form the pattern desired to be printed.

2. Description of the Prior Art

Lithographic printing, frequently referred to as offset printing, occupies a substantial segment of the printing plate market, primarily because it is an economical method for producing a large number of copies. Most lithographic plates today are of the presensitized type. Such plates are provided with a photosensitive coating which permits the formation of an image on the plate by exposure through a master transparency and subsequent development.

It has recently been proposed, see U.S. Pat. No. 3,664,737 granted May 23, 1972 for "Printing Plate Recording by Direct Exposure"(Lipp), to directly record information on a printing plate by means of a laser beam having a wave length in the actinic (UV) region. There are two major advantages of imaging by a laser beam. The first is that it permits the elimination of the master transparency. The images can be either computer generated or can be provided by scanning a paste-up or other original by appropriate photoelectronic means which in turn modulates the laser beam. The second advantage is that the signal, however generated, for modulating the laser which writes the image on the plate can be transmitted over great distances to a multiplicity of writing lasers. This obviously would be of particular significance to newspaper and magazine publishers who operate a number of regional printing facilities.

While the laser is a promising tool for the production of planographic printing plates and the proposal to directly image a presensitized lithographic printing plate with a laser beam having a wave length in the actinic region has great appeal, the proposal is not commercially practical for the reason that such lasers are extremely expensive, are not generally commercially available and, to date, their power output has been low. There are, on the other hand, non-actinic lasers available which are relatively inexpensive and which have a useful power output.

Therefore an object of this invention is to utilize non-actinic laser beams in the imaging of conventional presensitized planographic printing plates.

SUMMARY OF THE INVENTION

In accordance with the present invention a presensitized planographic printing plate, having a layer of material which is sensitive to ultraviolet light, is provided with a coating which is opaque to ultraviolet light and is capable of being removed or rendered transparent to ultraviolet light by non-actinic laser radiation. A mask or template is formed on the presensitized plate by selectively removing the layer which is opaque to ultraviolet light by means of an appropriate laser beam. The beam of radiant energy is applied to the opaque layer to vaporize and remove it in selected areas so that the remaining areas of the opaque layer define the areas which are to be exposed to ultraviolet.

The presensitized printing plate underlying the mask layer can be any one of the commercially available types of either positive working or negative working lithographic printing plates or it can be a dry planographic printing plate such as disclosed in U.S. Pat. No. 3,606,922, Doggett, granted Sept. 21, 1971. The construction or composition of the presensitized printing plate portion of the plate of the present invention is not critical for the reason that once the mask is formed in situ and the plate is exposed to ultraviolet light, development of the plate proceeds in a conventional manner.

The layer of material which is opaque to ultraviolet light and capable of being removed or rendered transparent to ultraviolet light by non-actinic laser radiation can be a metal layer or a dispersion of metal or carbon particles in an organic binder. Suitable metals include aluminum, copper and zinc. The metal film must be thick enough to be opaque to ultraviolet and it will normally be made as thin as practical in order for it to be vaporized and removed rapidly with a minimum amount of radiant energy applied by the laser for this purpose. By way of example, a zinc film on the order of one micro-inch in thickness satisfies the criteria. A suitable method for forming films of metal at such thickness is vacuum deposition. The layer of metal can be applied directly to the photosensitive surface of the presensitized printing plate but may also advantageously be applied to a thin film of a plastic such as a polyester which is then applied to the presensitized printing plate surface.

As indicated by U.S. Pat. No. 3,650,796 granted Mar. 21, 1972 for "Photolithographic Masks," selection of an appropriate laser for removing the layer of material which is opaque to ultraviolet light is well within the skill of the ordinary worker in the art to which the present invention pertains. Means for modulating a laser beam to record information on a substrate are also well known in the art and need not be discussed here. In general they can be characterized as scanning mechanisms which cause the beam to traverse the area, delivering energy in a predetermined manner. Suitable apparatus is disclosed in U.S. Pat. No. 3,739,088 granted June 12, 1973.

DESCRIPTION OF THE PREFERRED EMBODIMENTS

In the following examples a negative working diazo composition, the reaction product of p-diazodiphenylamine-formaldehyde condensation product and sodium lauryl sulfate was employed. The laser employed was a YAG(yttrium aluminum garnet) laser.

EXAMPLE I — illustrating the use of an aluminum mask.

Plate: An anodized and silicated 8 mil aluminum base coated with the identified ultraviolet sensitive (UV) coating by #10 mayer rod in an amount of 0.8 lbs./ream.

Over this dried coating was deposited from vapor in vaccum a 300 angstrom aluminum layer (mask).
Processing:
This mask was removed in selected areas by writing with a laser.

The entire plate was exposed for 60 seconds to a carbon arc whereby no longer masked UV sensitive areas were photopolymerized.

The remaining mask was removed using a 2% aqueous potassium hydroxide solution.

The unexposed UV sensitive layer was then removed by the application of a subtractive developer.

EXAMPLE II — Illustrating the use of a copper mask.

Plate:

A 12 mil substrate that was a paper-aluminum foil laminate was coated on its paper surface with a PVA composition to render it hydrophilic. To this substrate was applied the ultraviolet (UV) sensitive coating by #10 mayer rod in an amount of about 0.1 lbs./ream.

Finally over this dried coating was deposited a 50 angstrom copper layer deposited from vapor in vacuum.

Processing:

The plate was processed according to Example I with the exception that the UV sensitive layer was exposed to the carbon arc for 30 seconds.

On development a faint image was obtained.

EXAMPLE III — Illustrating the use of a laminate mask.

Plate:

To the ultraviolet (UV) sensitive coated base of Example I was adhered a mask which consisted of a vacuum deposited zinc layer on a polycarbonate film (film side adhered to base by an adhesive).

Processing:

This plate was laser scanned and then overall exposed to UV light for 45 seconds. Following this, the film was separated from the plate and the plate was subsequently developed with subtractive developer.

EXAMPLE IV — Illustrating the use of a pigmented mask.

Plate:

The aluminum base with the ultraviolet sensitive coating of Example I was coated with the following mask composition:

|  | Parts by weight dry |
|---|---|
| Carbon black | 30.2 |
| Ntrocellulose | 30.2 |
| Aluminum powder | 10.4 |
| Phenolic resin | 29.2 |

50/50 (by volume) mixture of xylene and ethyl cellosolve was added to adjust the solids content to 6.9% by weight.

The mask layer was applied at a weight of 0.7 lbs/ream.

Processing:

The plate was processed according to Example III. When mounted on an offset duplicating press the plate provided good quality prints.

EXAMPLE V — Illustrating the use of a pigmented mask.

Plate:

The aluminum base with the ultraviolet sensitive coating of Example I was coated with the following mask composition:

|  | Parts by weight |
|---|---|
| Carbon black | 25 |
| Nitrocellulose | 17.5 |
| Alkyd resin | 57.5 |

Methyl ethyl ketone was added to adjust the solids content to 8% by weight. The coating was applied by #10 mayer rod in an amount of 1.0 lbs./ream.

Processing:

The plate was processed according to the previous examples with the exception that the UV sensitive layer was exposed to the carbon arc for 2 minutes.

What is claimed is:

1. The method of imaging a planographic printing plate which comprises a support layer, a first layer of material which is sensitive to ultraviolet light and is overlying the support layer, and overlying and in contact with the first layer, a second layer which is opaque to ultraviolet light and is capable of being removed or rendered transparent to ultraviolet light by non-actinic laser radiation, said method comprising the steps of:

selectively removing or rendering transparent to ultraviolet light selected areas of the second layer while not affecting the first layer of material by projecting a beam of non-actinic laser radiation onto the second layer while in contact with the first layer, exposing said plate overall to ultraviolet light, removing the remaining portions of the first layer, and developing said plate.

* * * * *